United States Patent
Chu et al.

(10) Patent No.: US 6,396,567 B1
(45) Date of Patent: May 28, 2002

(54) METHOD AND APPARATUS FOR CONTROLLING THE DOSE OF RADIATIONS APPLIED TO A SEMICONDUCTOR WAFER DURING PHOTOLITHOGRAPHY

(75) Inventors: Tsu-Yu Chu; I-Chung Chang; Kun-Pi Cheng, all of Hsin-Chu (CN)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/324,129

(22) Filed: Jun. 2, 1999

(51) Int. Cl.[7] .................. G03B 27/72; G03B 27/42; G03B 27/54
(52) U.S. Cl. .................. 355/69; 355/53; 355/67
(58) Field of Search .................. 355/53, 55, 67–71; 250/492.2, 492.22, 492.23; 356/399–401

(56) References Cited

U.S. PATENT DOCUMENTS

| | | | | |
|---|---|---|---|---|
| 4,758,863 A | * | 7/1988 | Nikkel | 355/40 |
| 5,636,003 A | * | 6/1997 | Tanitsu et al. | 355/67 |
| 5,646,715 A | * | 7/1997 | Wangler | 355/67 |
| 5,675,401 A | * | 10/1997 | Wangler et al. | 355/67 |
| 5,708,526 A | * | 1/1998 | Stankewitz | 359/386 |
| 5,726,738 A | * | 3/1998 | Sohn et al. | 355/53 |
| 6,016,187 A | * | 1/2000 | Noguchi et al. | 355/53 |
| 6,028,660 A | * | 2/2000 | Van Der Laan et al. | 356/67 |
| 6,031,238 A | * | 2/2000 | Fujinoki et al. | 250/492.2 |
| 6,038,279 A | * | 3/2000 | Miyake et al. | 378/34 |
| 6,067,146 A | * | 5/2000 | Mulkens et al. | 355/71 |

* cited by examiner

*Primary Examiner*—Russell Adams
*Assistant Examiner*—Hung Henry Nguyen
(74) *Attorney, Agent, or Firm*—Randy W. Tung

(57) ABSTRACT

The two dimensional intensity profile of radiation applied to a semiconductor wafer during photolithography is controlled by passing the radiation beam through an attenuating member before the beam is imaged by a mask onto the wafer. The attenuating member is preferably ring shaped and is formed of a semi-transparent material such as Mo Bi Si O$_4$, or a material that is partially reflective of the radiation.

13 Claims, 3 Drawing Sheets

METHOD AND APPARATUS FOR CONTROLLING THE DOSE OF RADIATIONS APPLIED TO A SEMICONDUCTOR WAFER DURING PHOTOLITHOGRAPHY

TECHNICAL FIELD

The present invention generally relates to photolithography systems used in processes for manufacturing semiconductor devices, and deals more particularly with a method and apparatus for precisely controlling the dose of radiation to which a semiconductor wafer is subjected during exposure imaging.

BACKGROUND OF THE INVENTION

Modem fabrication processes for producing semiconductor devices, such as integrated circuits, have long employed photolithography for transferring circuit patterns onto a semiconductor substrate, such as a wafer. In general, photolithography involves the performance of a sequence of process steps, including coating a semiconductor wafer with a resist layer, exposing the coated wafer to a patterned light source, developing the resist layer, processing the semiconductor wafer through the developed resist layer, and removing the resist layer. An optical photolithography stepper apparatus, sometimes referred to as a "step and scan" or "stepper", is typically used to expose the resist layer. An image of each layer of an IC die is formed on a small rectangular piece of glass referred to as a reticle or mask. The mask or reticle is placed on the stepper and a reduced image thereof is projected onto a portion of the resist layer covering the semiconductor wafer. Specifically, the reticle patterns are transferred to the wafer by scanning the patterns through a narrow illumination slit.

When numerous IC's are to be fabricated from a single wafer, a mask used in the fabrication of any one IC is also used in the fabrication of the other IC's from the wafer. This is accomplished by using the stepper to index or "step" lie wafer under an optical system which includes the mask or reticle. At each step, the photoresist is exposed to the optical system, typically with ultraviolet light, to form an aerial image of the mask on the layer of photoresist. The wafer is then removed from the stepper and the image is developed. At that point, the wafer is etched to remove portions of the underlying film, following which the wafer is ready for the next stage of processing, which might include for example, ion implantation, deposition or other types of etching processes. At a later stage in the fabrication process, the wafer is returned to the stepper for exposure of the wafer to a different mask.

The reticle or mask is composed of a glass substrate, such as quartz, on which there is formed a circuit pattern composed of materials such as chromium which prevents ultraviolet light rays from transmitting therethrough. The reticle is set in the stepper in order to expose a semiconductor wafer to light, and the circuit pattern formed on the reticle is imaged by the stepper onto the semiconductor substrate.

Semiconductor manufacturing processes are aimed at achieving up to 0.25 micron resolution in a high production environment. This goal is being driven by the need to develop competitive device performance and lower manufacturing costs per device. In order to increase the field size and improve critical dimensional control below 0.25 micron resolution, improvements is step and scan technology will play a critical role. Improvements in the area of highly controllable, precise light sources, such as excimer lasers with appropriate dose control are important for solving illumination control problems and achieving exceptionally short exposure times.

In order to more precisely control the dose of light radiation projected on the wafer, the illumination system and scanner slit have, in the past, been provided with an adjustment that allows focusing of the image applied to the wafer. This adjustment system relies on movement and adjustment of mechanical elements, and particularly the displacement of the mechanical slit relative to the illumination source. As a result of the dependency on this mechanical adjustment, repeatable results are not always obtained from batch to batch since adjustment settings may change for a number of reasons. Moreover, the need to perform periodic preventive maintenance on equipment introduces the further possibility that adjustment settings may be inadvertently altered, thus making repeatable, precise dosage control possible.

Accordingly, there is a clear need in the art for a system for controlling radiation dosage and intensity profile in a manner that does not rely on mechanical adjustments, and thus provides stable, repeatable dosage control. The present invention is directed towards satisfying this need in the art.

SUMMARY OF THE INVENTION

According to one aspect of the invention, apparatus is provided for controlling the dose of radiation exposure applied to a semiconductor wafer during a photolithography process. The apparatus broadly comprises a source of radiation such as ultraviolet light; a set of reticle masking blades for masking a pattern of radiation on to the wafer, means for delivering radiation from the radiation source through the masking blades, and means juxtaposed between the masking blades and the delivery means for shaping the intensity profile of the radiation passing between the blades and reticle, which is applied to the wafer. The shaping means preferably includes an angularly shaped member formed of a material that is either semitransparent to or partially reflective of the radiation. The angularly shaped member preferably possesses a generally rectangular cross section and is formed of Mo Bi Si $O_4$. The shaping member extends around a masking opening defined between opposing sets of the blades. A beam of radiation transmitted from the source passes through the ring so as to alter the two dimensional intensity profile of the radiation, following which the shaped beam passes through the masking blades and reticle so as to image onto the wafer.

According to another aspect of the invention, apparatus is provided for exposing a semiconductor wafer to radiation during a photolithography process, which includes a source of radiation, means for forming the radiation source into a beam, a mask for forming a pattern of the radiation on the wafer, means for directing the beam onto the mask, and means for shaping the intensity of the radiation applied over two dimensions across the wafer. The shaping means include a member formed of partially transparent or translucent material and positioned such that the beam passes through the shaping member. The delivery means preferably includes a quartz rod for carrying the beam, and the mask includes at least two opposing blades disposed downstream of the rod in the optical delivery path of the beam, wherein the shaping member is juxtaposed between the rod and the blades. The rod possesses a circular end through which the beam exits the rod, and the shaping member is angularly shaped and is mounted at the rod end concentric with the rod.

According to another aspect of the invention, a method is provided for controlling the dosage of radiation applied to a semiconductor wafer during a photolithography process, comprising the steps of: generating a beam of radiation; supplying a mask for masking the radiation applied to the wafer; and attenuating portions of the beam by passing the beam through a radiation attenuating member before the beam passes through the mask. The beam is generated by passing radiation through a quartz rod and attenuation is achieved by placing the attenuating member between the rod and the mask.

A still further aspect of the invention comprises a method of controlling the dosage of radiation applied to a semiconductor wafer during a photolithography process used to manufacture the wafer, comprising the steps of: generating a beam of radiation; passing the beam through a ring shaped member formed of a radiation attenuating material, whereby to alter the intensity of the radiation in two dimensions across the beam, and then, passing the attenuated beam through a mask onto the wafer.

Accordingly, it is a primary object of the present invention to provide a method and apparatus for controlling the dose of radiation exposure applied to a semiconductor wafer during a photolithography process employed to image circuit pattern onto the wafer.

Another object of the invention is to provide a radiation dose control method and apparatus as described above which eliminates dependency on mechanical mechanisms and provides highly repeatable results from batch to batch and machine to machine.

A further object of the invention is to provide a method and apparatus of the type mentioned above which allows for precise control of radiation profiles in two dimensions across the surface of the wafer.

A still further object of the invention is to provide a method and apparatus for control of radiation dosage as referred to above which is particularly simple and economical.

These, and further objects and advantages of the present invention will be made clear or will become apparent during the course of the following description of the preferred embodiment of the invention.

DESCRIPTION OF THE PREFERRED EMBODIMENT

Figure 1:
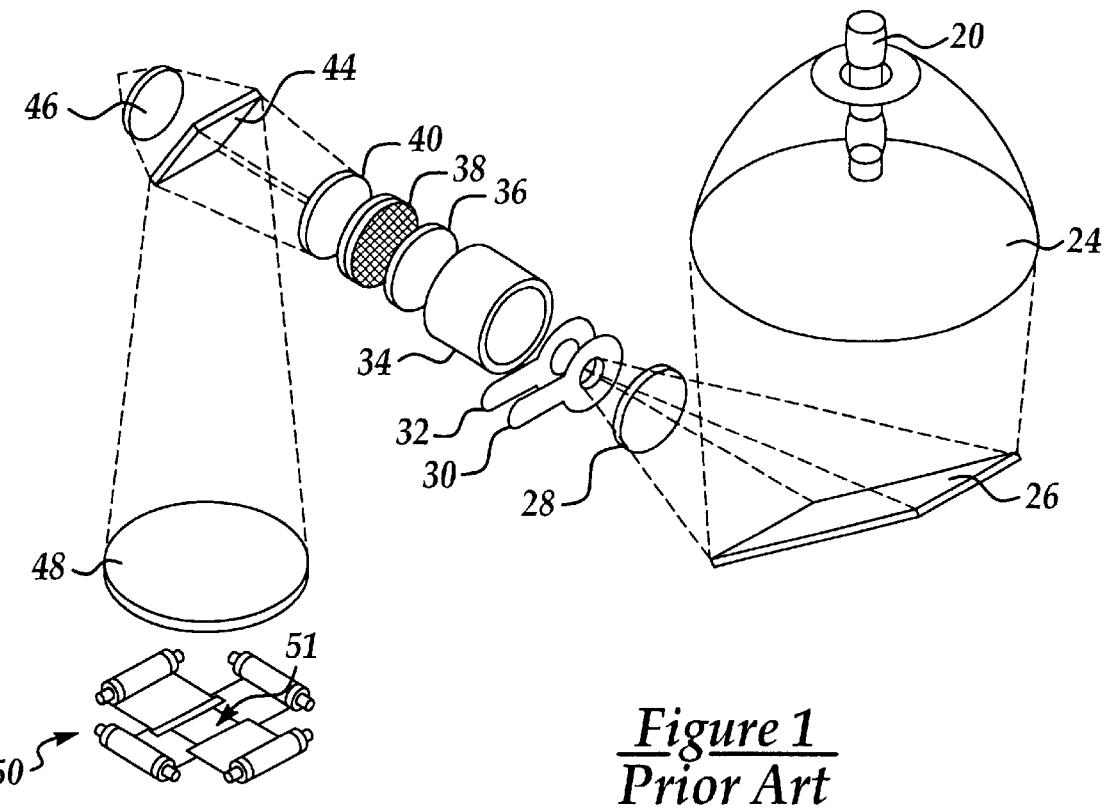
FIG. 1 is a perspective view of a conventional photolithographic system.

Referring first to FIGS. 1–4 which depict a prior art photolithography illumination system and related dosage control technique, radiation in the form of ultraviolet light is produced by a lamp 20 and is focused by a reflector 24 onto a reflecting mirror 26 to produce a beam of light which is sequentially passed through a filter 28, shutter 30, attenuator 32, zoom lens 34, interference filters 36, integrator lens 38 and field lens 40 onto a aluminized mirror 44. A portion of the beam focused onto the mirror 44 passes therethrough onto an energy sensor 46 which measures the intensity of the beam. The reminder of the beam is reflected by the mirror 44 as a beam spot 48 which is directed through a reticle masking blades 50 defining a slit 51 thence through a reticle or mask (not shown). Radiation in the beam passes through the slit 51 and circuit pattern defining reticle and is focused onto a semiconductor wafer 54 that is supported on an exposure chuck 52 provided with a spot meter 56 for measuring the intensity of the beam focused onto a portion of the wafer 54.

Figure 2:
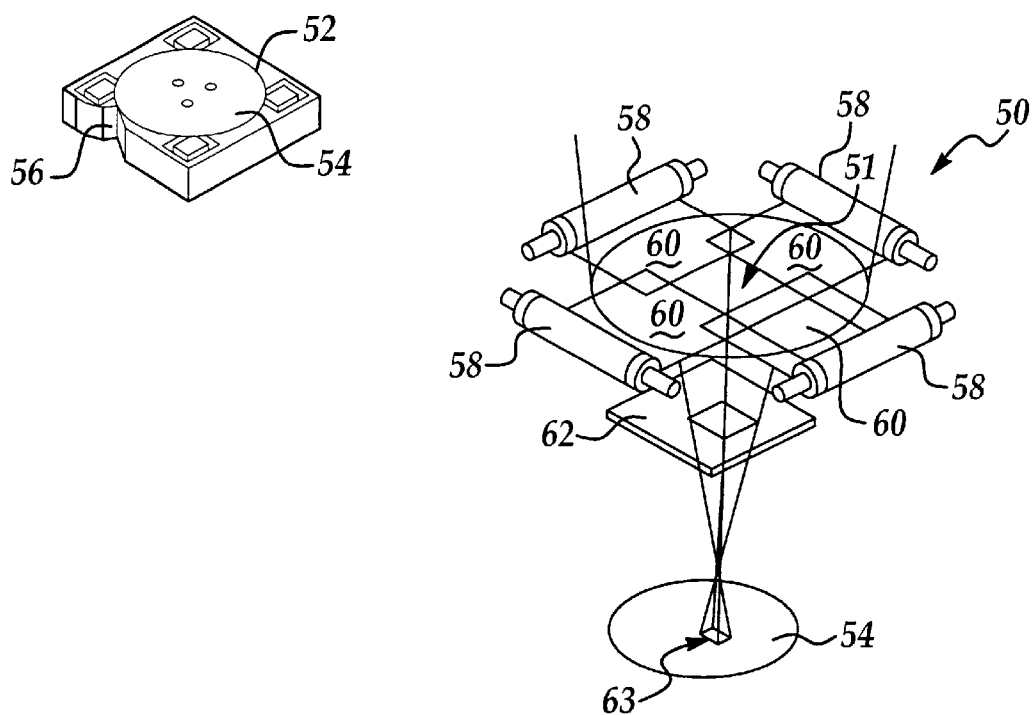
FIG. 2 is a perspective view of the reticle masking blades, reticle and a wafer.

As best seen in FIG. 2, the reticle comprises four masking blades 60 arranged in two opposing pairs to define and generally rectangular slit 51. Light passing through the slit 51 thence passes through a reticle 62 having a circuit pattern thereon so as to focus the radiation into a pattern 63 on the wafer 54.

Figure 3:
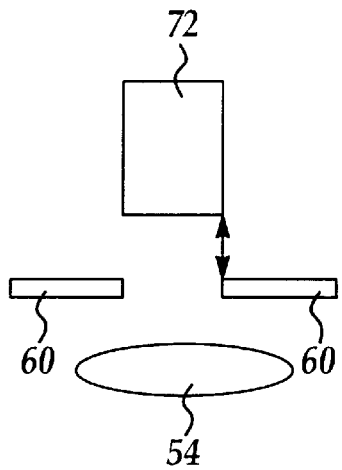
FIG. 3 is an illustration of the positioning of a quartz rod, REMA blades in relation to a wafer.

In an improved form of the apparatus shown in FIG. 1, there is provided as shown in FIG. 3, a quartz rod 72 which is employed to conduct the beam from the radiation source through the slit 51 defined by the blades 60.

Figure 4:
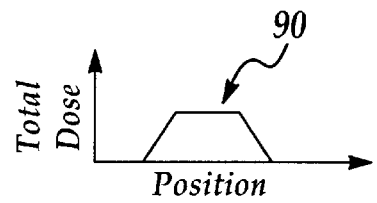
FIG. 4 is a graph illustrating a radiation dosage formed by the conventional photolithographic apparatus.
Figure 5:
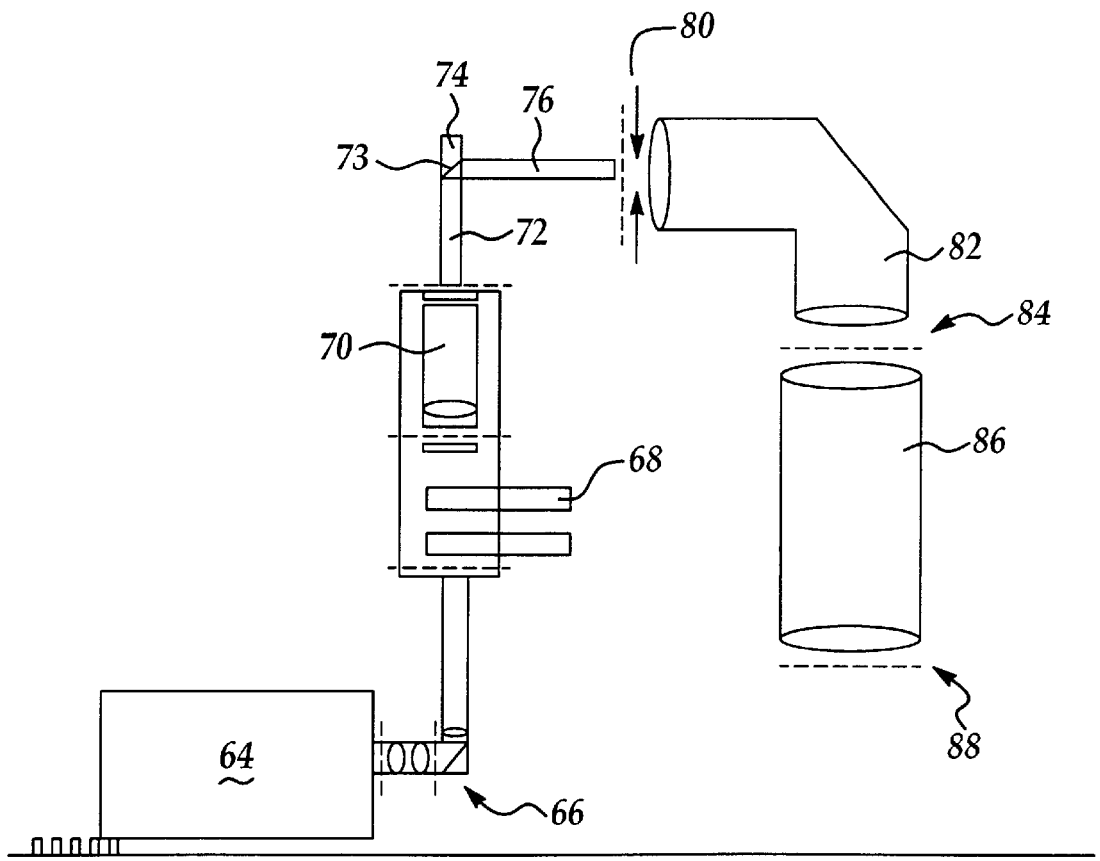
FIG. 5 is an illustration of the present invention photolithographic apparatus.
Figure 6:
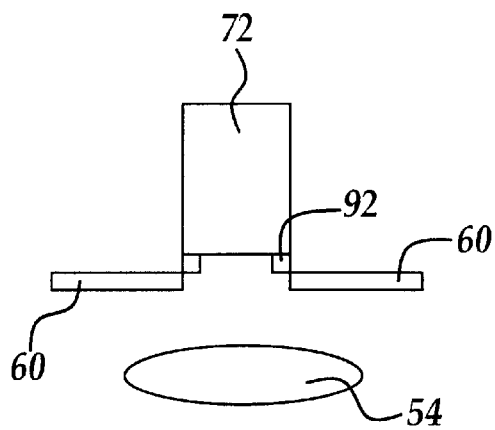
FIG. 6 is an illustration of the present invention quartz rod, ring-shaped radiation beam shaping member, REMA blades positioned in relation to a wafer.
Figure 7:
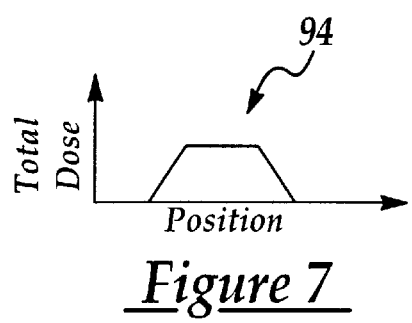
FIG. 7 is an illustration of a trapezoidal shaped radiation dosage produced by the present invention ring-shaped radiation shaping means.
Figure 8:
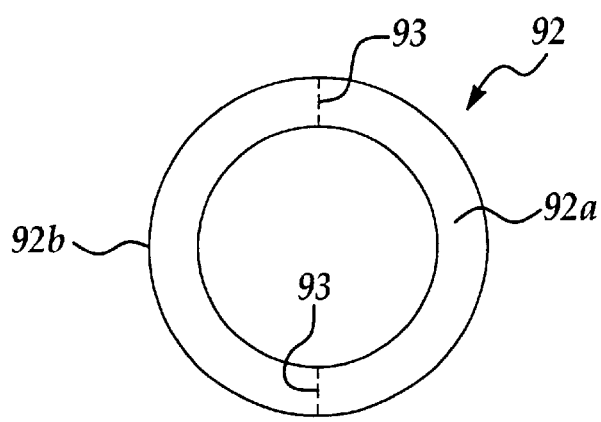
FIG. 8 is a plane view of the present invention ring-shaped radiation shaping means.
Figure 9:
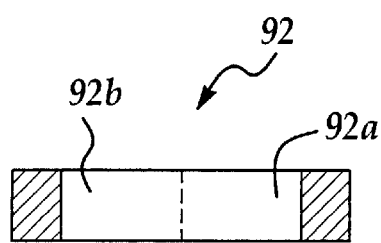
FIG. 9 is a cross-sectional view of the present invention ring-shaped radiation shaping means.

The two dimensional profile of the dose or radiation beam focused on the wafer 54 is essentially in the form of a square wave as the reticle 62 is stepped across the wafer 54. In order to smooth out discontinuities between the successive square waves, others in the past have resorted to a form of de-focusing of the beam which results in the production of a trapezoidal dosage 90 of radiation, as best seen in FIG. 4. As the reticle 62 is stepped across the wafer 54, the trapezoidal dosages 90 tend to closely overlap each other, thus providing a nearly continuous intensity profile as the reticle 62 is stepped across the wafer 54, in contrast to previous techniques in which there were discontinuities between the beam intensity profiles from step to step.

Attention is now directed to FIGS. 5–10 wherein the apparatus of the present invention is depicted in detail. A source of illuminating radiation in the form of an excimer laser 64 produces a beam of coherent light which is delivered through a beam expander 66 and thence through a variable attenuator 68 to a zoom lens 70. The zoom lens 70 outputs a beam having a diameter determined by the setting of the zoom lens 70 which is passed longitudinally through a quartz rod 72 and is reflected by a reflector 73 into a second quartz rod 76. An energy sensor 74 is provided to sense the intensity of the radiation beam passing through rod 72. The radiation beam output by rod 76 is delivered through a set of reticle masking blades generally indicated by the numeral 60, similar to that depicted in FIG. 2. The masked beam is then passed through a reticle masking lens 82 so as to be projected onto a reticle generally indicated by the numeral 84, and similar to that shown in FIG. 2 above. The shaped beam is then delivered from the reticle 84 through a projection lens 86 onto a semiconductor wafer generally indicated at the position 88.

Figure 10:
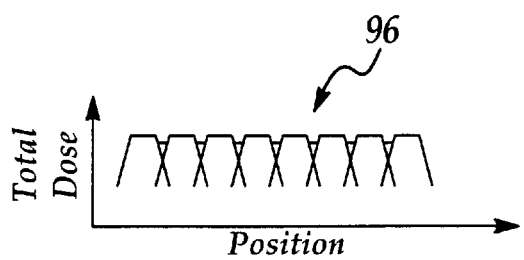
FIG. 10 is a graph illustrating a composite curve of a multiple number of trapezoidal radiation waves.

It has been discovered that the two dimensional (across the face of the wafer 54) profile of the radiation beam can be altered and adjusted by interposing a beam shaping member between the reticle masking blades 60 and the end of the quartz rod 72 through which the beam exits. The beam shaping member is preferably in the form of an angularly or ring shaped member 92 having a central opening therein, and a general rectangular cross section. The beam shaping member 92 is formed of a semi-transparent, translucent, or partially reflective material. One suitable material for use in forming the beam shaping member 92 is Mo Bi Si $O_4$. In a preferred form of the invention, a ring shaped, beam shaping member 92 is mounted on the end of a rod 72, concentric with the central axis of the rod 72, with at least two opposing blades 60 contacting the bottom edge of the member 92, such that the radiation beams exiting the rod 72 passes through the member 92. The central portion of the beam passes through the central opening in the member 92, while the outer peripheral portion of the beam is forced to pass through the annular body of the member 92, thereby effectively attenuating the outer periphery boundary of the beam. As a result, the intensity profile, i.e. total illumination dose delivered through the surface of the wafer 54 during a single exposure is generally trapezoidal in shape as indicated by the waveform 94 in FIG. 7. As the illumination system is stepped over the surface of the wafer 54, successive exposures result in a series of overlapping but individual exposures or intensity profiles which collectively form an essentially smooth, steady intensity profile 96, as shown in FIG. 10.

In some cases it may be desirable to form the beam shaping member 92 into two opposing portions 92A, 92B which are separated at a parting line 93. The two portions 92A, and 92B are then respectively mounted on a pair of opposing blades 60 for movement along with the latter.

From the above description of the apparatus it may be appreciated that a method is provided for controlling the dose of radiation applied to the wafer 54 which comprises the steps of generating a beam of radiation using the laser 64, passing the beam through a ring shaped member 92 formed of radiation attenuating material so as to alter the intensity profile of the radiation in two dimensions across the beam, and then passing the beam through a mask or reticle onto the wafer.

From the foregoing, it may be appreciated that the present invention not only provides for the reliable accomplishment of the objects of the invention, but it does so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. Apparatus for controlling a dose of radiation exposure applied to a semiconductor wafer device during a photolithography process, comprising:

a source of radiation;

masking means including a set of reticle masking blades for masking a pattern of radiation applied to said wafer;

means for delivering radiation from said radiation source to said masking blades; and means positioned between said masking blades and said delivering means for shaping the intensity profile of the radiation passing between said blades and applied to said wafer, said shaping means is formed of $MoBiSiO_4$.

2. The apparatus of claim 1, wherein at least two of said blades are moveable toward and away from each other, and said annularly Shaped member includes first and second positions respectively moveable with said blades.

3. The apparatus of claim 1, wherein said angularly shaped member possesses a generally rectangular cross section.

4. The apparatus of claim 1, wherein said shaping member is essentially ring-shaped and extends around a masking opening between said blades.

5. Apparatus for exposing a semiconductor wafer to radiation during a photolithography process, comprising;

a source of radiation;

means for forming radiation from said source into a beam;

a mask for forming a pattern of said radiation on said wafer;

means for directing said beam onto said mask; and means for shaping the intensity of said radiation applied over two dimensions across said wafer, said shaping means is essentially ring-shaped and formed of $MoBiSiO_4$.

6. The apparatus of claim 5, wherein said shaping means includes a member formed of partially transparent material and positioned such that said beam passes through said member.

7. The apparatus of claim 6 wherein said member is ring shaped and has a central opening through which a portion of said beam passes.

8. The apparatus of claim 5, wherein:

said delivering means includes a quartz rod for carrying said beam, said mask includes at least two opposing blades disposed downstream of said rod in the optical delivery path of said beam, and said shaping member is positioned between said rod and said blades.

9. The apparatus of claim 8 wherein:

said rod possesses a circular end through which said bean exits from said rod, and said shaping member is ring shaped and is mounted adjacent to and concentric with said rod.

10. The apparatus claim 5, wherein said shaping means is formed of a material which attenuates an amount of light passing through said mask onto said wafer.

11. The apparatus claim 10, wherein said shaping means is partially reflective of said radiation.

12. A method of controlling the dosage of radiation applied to a semiconductor wafer during a photolithography process used to manufacture said wafer, comprising the steps of:

(A) generating a beam of said radiation;

(B) passing said beam through a ring shaped member formed of $MoBiSiO_4$ to alter the intensity of the radiation in said beam; and (C) passing said beam through a mask onto said wafer.

13. The apparatus of claim 12, including the step of placing said ring shaped member between a beam source and said mask.

* * * * *